United States Patent [19]
Dubovsky et al.

[11] 4,361,821
[45] Nov. 30, 1982

[54] CAPACITOR COUPLING ARRANGEMENT FOR UHF RESONANT STRUCTURE

[75] Inventors: George S. Dubovsky, Forest; Henry A. Schaefer, Lynchburg; Ralph R. Sherman, Forest, all of Va.

[73] Assignee: General Electric Company, Lynchburg, Va.

[21] Appl. No.: 253,306

[22] Filed: Apr. 13, 1981

[51] Int. Cl.³ .............................................. H03H 7/01
[52] U.S. Cl. .................................. 333/219; 333/185; 333/202; 334/74
[58] Field of Search .............. 333/168, 185, 202, 219, 333/222, 230; 334/73, 74

[56] References Cited

U.S. PATENT DOCUMENTS 2,176,064 10/1939 Cole et al.
2,508,840 5/1950 Schaper.
2,728,052 12/1955 Van Duyne.
2,753,530 7/1956 Horvath ............................ 333/202
3,836,881 9/1974 Koizumi.
4,061,992 12/1977 Inokuchi.

Primary Examiner—Paul L. Gensler
Attorney, Agent, or Firm—James J. Williams

[57] ABSTRACT

Precise capacitive coupling to a coil is provided by a coil form having a central winding portion for a coil and having transverse flanges at the ends of the winding portion. The flanges are shaped and dimensioned to fit in a structure or resonant cavity, and have facing grooves for receiving and holding a sheet of insulating material in a plane substantially parallel to the coil winding portion. A metallic plate of predetermined size and location is positioned on the insulating sheet, and provided with a connection to an external circuit. The metallic plate provides capacitive coupling to a coil wound on the winding portion. This coupling is of predetermined magnitude and repeatable consistency, since identical coil forms can be made to hold their respective insulating sheets and metallic plates in the same location.

11 Claims, 3 Drawing Figures

U.S. Patent    Nov. 30, 1982    4,361,821
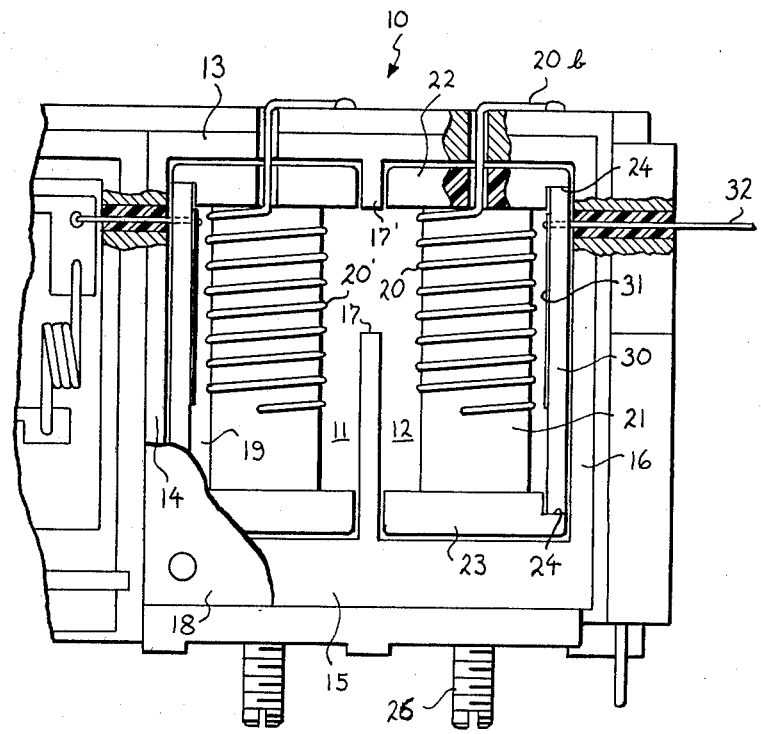
FIG. 1
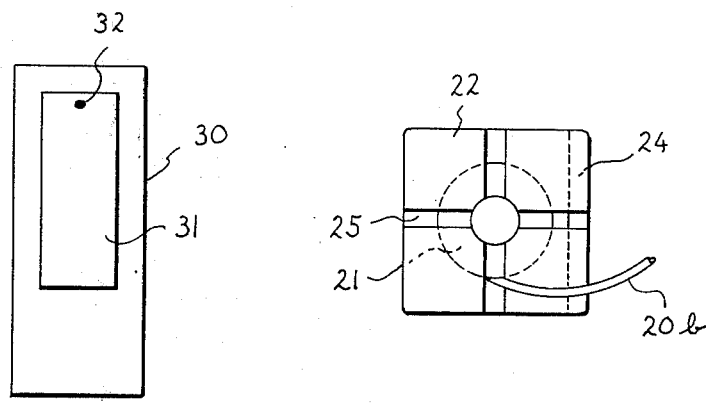
FIG. 2
FIG. 3

CAPACITOR COUPLING ARRANGEMENT FOR UHF RESONANT STRUCTURE

BACKGROUND OF THE INVENTION

Our invention relates to a capacitor coupling arrangement, and particularly to an arrangement for providing an accurate capacitor coupling between a helical coil and an external circuit.

In radio and electronic apparatus, particularly for the ultrahigh frequencies and upward, coils are positioned in a cavity or other structure to form a resonant device that provides a filter or other type of frequency selective function. Previously, a connection or coupling between the coil and an external circuit was made by a conductor connected to a selected point or tap on the coil or by a loop positioned in the structure near the coil. Both these and other prior art arrangements had disadvantages, such as relatively time consuming and expensive production. Even when produced, such arrangements were relatively difficult to produce in mass production with consistent and similar characteristics.

Accordingly, a primary object of our invention is to provide a new and improved capacitor coupling arrangement.

Another object of our invention is to provide a new and improved arrangement that provides repeatably consistent coupling to a coil in a resonant structure.

Another object of our invention is to provide a new and improved capacitor coupling arrangement that is relatively easy and inexpensive to manufacture.

SUMMARY OF THE INVENTION

Briefly, these and other objects are achieved in accordance with our invention by a coil form having a central winding portion for a coil and having transverse flanges at the ends of the winding portion. The flanges are shaped and dimensioned to fit in a structure or resonant cavity, and having facing grooves for receiving and holding a sheet of insulating material in a plane substantially parallel to the coil winding portion. A metallic plate of predetermined size and location is positioned on the insulating sheet, and provided with a connection to an external circuit. The metallic plate provides capacitive coupling to a coil wound on the winding portion. This coupling is of predetermined magnitude and repeatable consistency, since identical coil forms can be made to hold their respective insulating sheets and metallic plates in the same location.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

FIG. 1 shows a side elevation view, partly in cross section, of a resonant cavity structure provided with a coil form and capacitor coupling arrangement in accordance with our invention;

FIG. 2 shows a view of a sheet of insulating material and a metallic plate for providing the capacitive coupling in our arrangement of FIG. 1; and FIG. 3 shows an end view of a coil form used in our arrangement of FIG. 1.

DESCRIPTION OF THE PREFERRED EMBODIMENT

As an example of an application of our invention, we have chosen an ultrahigh frequency resonant structure 10 having two cavities 11, 12 formed by metallic walls 13, 14, 15, 16, and partially separated by metallic partitions 17, 17'. The cavities 11, 12 are closed by a front 18 (partly removed) and a back 19. Each of the cavities 11, 12 is provided with a helical coil 20', 20 respectively which, as mentioned earlier, must be connected or coupled to external circuits. For the ultrahigh frequencies, the actual structure 10 may be smaller than FIG. 1, so that there is obviously very little space or room in such a structure. Hence, the prior art arrangements for connecting the coils 20, 20' to external circuits has not only been difficult because of the tap or loop arrangements required, but also because of the small and limited space. In the following description of our invention, only our arrangement for the right hand coil 20 will be described, since both arrangements in FIG. 1 are substantially identical. Our arrangement includes a cylindrical coil form 21 which has transverse flanges 22, 23 at its ends. The flanges 22, 23 are dimensioned to hold the structure snugly in the cavity. The coil form 21 and flanges 22, 23 are preferably molded as an integral piece from suitable insulating material such as a thermosetting plastic. Each of the flanges 22, 23 is provided with a groove or notch 24. These grooves 24 face inwardly toward each other, have substantially parallel edges or configurations, and are spaced equally from the central or longitudinal axis of the coil form 21. FIG. 3 shows a top view of the flange 22, and shows the location and configuration of the groove 24. This flange 22 also has one or more radial slots 25 for the end of the helical coil 20 to be brought out on a lead 20b as seen in a cross sectional portion of FIG. 1.

Capacitive coupling to the coils 20 is provided by a rectangular sheet 30 of insulating material having a metallic plate 31 cemented or deposited on a large surface of the sheet 30 as shown in FIG. 2. A connection is provided to the metallic plate 31 by a wire or conductor 32 which we prefer pass through the insulating sheet 30 and be soldered or connected to the metallic plate 31. This wire 32 passes through a wall of the cavity, and is insulated therefrom for connection to an external circuit as shown in a cross-sectional portion of FIG. 1.

When our arrangement is manufactured, the coil forms 21 and flanges 22, 23 are cast in a suitable mold. A coil 20 is then wound on each coil form 21 and held thereon by any suitable means. Insulating sheets 30 of the proper size are cut or stamped, and provided with the metallic plates 31 of predetermined area. The insulating sheets 30 are then placed in the grooves 24, and held either by friction or by suitable cement. The grooves 24 position the insulating sheets 30 and metallic plate 31 at a precise distance from the wound coil 20, and the area of the metallic plate 31 along with this precise spacing provides the exact capacitive coupling needed for the turns of the coil 20. The conductor 32 is soldered or attached to the metallic plate 31 and brought out through a suitable insulated opening in a wall 16 of the cavity 12. Likewise, the lead or end 20b of the coil 20 is passed through a suitable hole or opening in a wall 13 of the cavity 12, and typically is soldered or connected to the cavity wall 13. However, depending upon the use for the structure, the lead 20b may be insulated from the cavity wall 13. Finally, tuning slugs 26 may be threaded into suitable openings in a cavity wall 15 to extend up and into a central opening in the coil form 21 to provide adjustable tuning for each of the coils.

It will thus be seen that we have provided a new and improved coupling arrangement for connecting a resonant coil in a cavity to an external circuit by means of a capacitor whose degree of coupling can be precisely controlled by locating the capacitive plate relative to the coil turns by means of flanges in the coil form, and by trimming the area of the metallic plate to the desired size. While we have shown only one embodiment of our invention, persons skilled in the art will appreciate the modifications that may be made. For example, the grooves may have three surfaces rather than the two shown, if it is preferable that the insulating sheets 30 be more rigidly held. However, we have found that with a reasonably tight friction fit, the grooves with only two surfaces hold the insulating sheets sufficiently well. The flanges may have a small hole or holes in place of the radial slots for the coil end. And, the coil form may have grooves to position the coil turns, and other cross-sectional shapes. Therefore, while our invention has been described with reference to a particular embodiment, it is to be understood that modifications may be made without departing from the spirit of the invention or from the scope of the claims.

What we claim as new and desire to secure by Letters Patent of the United States is:

1. An improved coil and capacitor assembly for use in ultrahigh frequency radio circuits and the like comprising:
   a. an insulating form extending along an axis for receiving a coil;
   b. first and second insulating flanges positioned at opposite ends of said form, each of said flanges having a groove positioned on a surface at corresponding facing locations that are equally spaced from said axis;
   c. an insulating member positioned in and extending between said grooves;
   d. a metallic plate positioned on said insulating member on a surface thereof facing said insulating coil form to provide capacitive coupling;
   e. and means for connecting said metallic plate to an external circuit.

2. The improved assembly of claim 1, and further comprising a coil wound around said insulating form in the vicinity of said metallic plate.

3. The improved assembly of claim 1 or claim 2 wherein said flanges extend transversely to said axis.

4. The improved assembly of claim 1 or claim 2 wherein said insulating form is substantially cylindrical.

5. The improved assembly of claim 4 wherein said flanges extend transversely to said axis.

6. The improved assembly of claim 1 or claim 2 wherein said insulating member frictionally engages said grooves.

7. The improved assembly of claim 6 wherein said flanges extend transversely to said axis.

8. The improved assembly of claim 3 wherein said insulating member frictionally engages said grooves.

9. The improved assembly of claim 8 wherein said flanges extend transversely to said axis.

10. An improved coupling arrangement for a resonant structure or the like comprising:
    a. a metallic enclosure having at least one pair of facing parallel sides;
    b. a coil form of insulating material, said coil form having a cylindrical portion symmetrically located with respect to a concentric axis and having a transverse flange at each end of said cylindrical portion, each of said flanges having parallel edges for fitting between said parallel sides of said enclosure, and having a groove extending parallel to said edges, said grooves facing each other and being located substantially the same distance from said concentric axis;
    c. a coil wound on said coil form between said flanges;
    d. a sheet of insulating material extending between and positioned in said grooves;
    e. a metallic plate positioned on said sheet of insulating material on the side thereof facing said coil;
    f. and means for connecting at least one end of said coil to an external circuit and for connecting said metallic plate to an external circuit.

11. The improved coupling arrangement of claim 10 wherein said coil form is molded as a single integral structure.

* * * * *